United States Patent
Wielgus et al.

(10) Patent No.: US 8,134,233 B2
(45) Date of Patent: Mar. 13, 2012

(54) METHOD AND APPARATUS FOR PROVIDING ELECTRICALLY ISOLATED CLOSELY SPACED FEATURES ON A PRINTED CIRCUIT BOARD

(75) Inventors: Jerzy Wielgus, Mt. Prospect, IL (US); Daniel R. Gamota, Palatine, IL (US); Tomasz L. Klosowiak, Glenview, IL (US); John B. Szczech, Schaumburg, IL (US); Kin P. Tsui, Morton Grove, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 1168 days.

(21) Appl. No.: 11/830,348

(22) Filed: Jul. 30, 2007

(65) Prior Publication Data
US 2009/0034215 A1 Feb. 5, 2009

(51) Int. Cl.
*H01L 23/34* (2006.01)
*H05K 7/00* (2006.01)

(52) U.S. Cl. ........ 257/725; 361/760; 361/761; 361/762; 29/825

(58) Field of Classification Search .......... 257/678, 257/723, 725, 734, 739, 773, 776, 780, 781, 257/784; 361/600, 679.01, 748, 760–762; 29/592.1, 825
See application file for complete search history.

(56) References Cited

U.S. PATENT DOCUMENTS

| | | | |
|---|---|---|---|
| 3,978,443 A | 8/1976 | Dennis et al. | |
| 4,366,198 A | 12/1982 | Ramspacher, Jr. | |
| 5,115,082 A * | 5/1992 | Mercer et al. | 528/219 |
| 5,122,929 A | 6/1992 | Palanisamy et al. | |
| 6,394,819 B1 | 5/2002 | Mosser, III et al. | |
| 6,905,906 B2 | 6/2005 | Sirringhaus et al. | |
| 7,138,331 B2 * | 11/2006 | Park et al. | 438/622 |
| 7,169,224 B2 | 1/2007 | Li et al. | |
| 7,169,687 B2 | 1/2007 | Li et al. | |

FOREIGN PATENT DOCUMENTS

WO WO02095805 A2 11/2002
WO WO2004042837 A2 5/2004

OTHER PUBLICATIONS

Ki Wan Kim, "PCT International Search Report and Written Opinion," WIPO, ISA/KR, Korean intellectual Property Office, Daejeon, Republic of Korea, Mar. 13, 2009, 10 pages.
Corresponding Chinese Application No. 200880101209.X—Second Office Action—Issued Jul. 29, 2011—4 pages.
Corresponding Chinese Application No. 200880101209.X—Second Office Action—Issued Feb. 2, 2011—3 pages.

* cited by examiner

*Primary Examiner* — Jasmine Clark

(57) ABSTRACT

A method and apparatus for forming controlled stress fractures in metal produces electrically isolated, closely spaced circuit sub-entities for use on a metallized printed wiring board. A polymeric substrate has a layer of metal adhered to the surface, and the metal layer is formed into entities. Each entity has a fracture initiating feature formed into it, which serves to initiate and/or direct a stress crack that is induced in the metal. The entities are fractured in a controlled manner by subjecting the substrate and the entities to mechanical stress by a rapid thermal excursion, creating a stress fracture in the entity extending from the fracture initiating feature. The stress fracture divides each entity into two or more sub-entities that are electrically isolated from each other by the stress fracture. The resulting structure can be used to form circuitry requiring very fine spaces for high density printed circuit boards. The rapid thermal stress may be induced by a high intensity, strobed xenon arc lamp.

17 Claims, 4 Drawing Sheets

METHOD AND APPARATUS FOR PROVIDING ELECTRICALLY ISOLATED CLOSELY SPACED FEATURES ON A PRINTED CIRCUIT BOARD

FIELD OF THE INVENTION

The present invention relates generally to fine features in metal circuitry on printed circuit boards, and more particularly, to a method for creating fine features using thermal and mechanical stressing.

BACKGROUND

Conventional fabrication methods for printed circuits have always utilized one or more methods of creating a conductive metal pattern on a dielectric substrate. Some of the various methods include print and etch, electroless copper deposition, vacuum deposition, and on-contact screen printing, contact printing, or ink jetting a liquid slurry of metal onto the substrate. Some of these methods are subtractive, such as the "print and etch" technique where patterns are etched from a laminated copper foil, others are purely additive, such as screen or thick film printing where conductor patterns are directly formed on the substrate, and still others are combinations of additive and subtractive. One technique that is gaining popularity is the fabrication of printed electronic circuitry using graphic arts technology, as it has the potential to produce very inexpensive circuits in very high volumes. However, current graphic arts technology is limited in the feature size that can be achieved, the current limit of resolution between two metal conductors being about 10-50 micrometers. Researchers are investigating the development of new functional inks and novel methods of graphic arts feature imaging, such as gravure cylinders, flexo plates, stencil screens, etc. to achieve finer printed feature resolution. All these printing techniques rely on optimizing the wetting characteristics between the ink and the substrate interface to create high resolution images. Generally, this requires some modification of the substrate wetting properties, typically via altering the substrate surface by corona discharge, chemical coating, or plasma treatment. Although these techniques can alter the substrate surface enough to provide good adhesion and wetting, they increase the surface roughness, thereby limiting the formation of very fine features, such as spaces between printed structures, i.e. conductors, of less than 10 micrometers. An improved method of forming fine features on printed circuitry using graphic arts techniques would be a significant contribution to the art.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
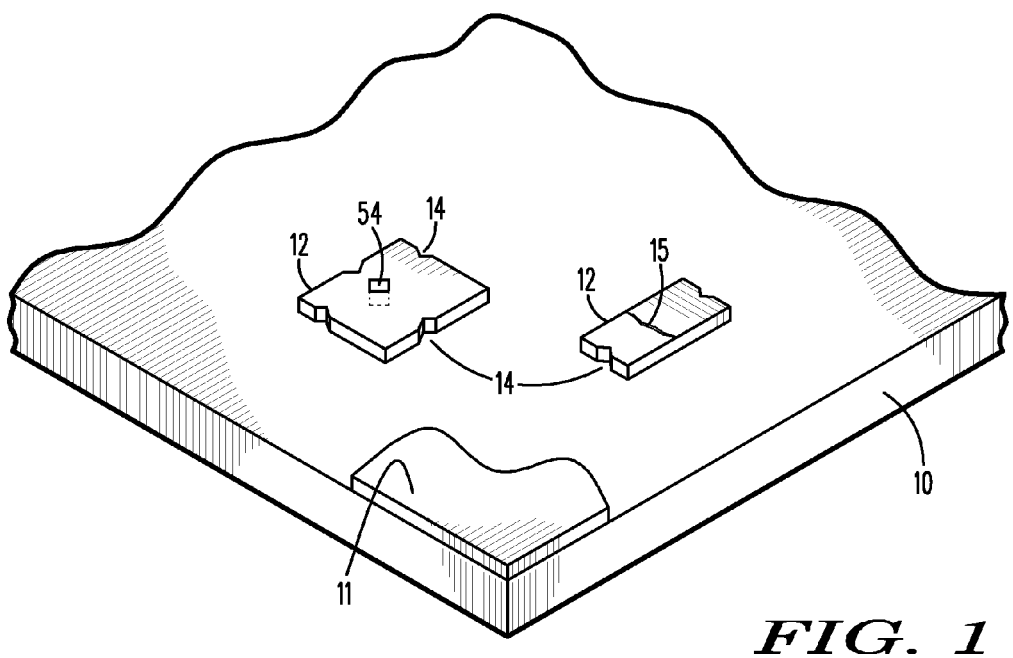
FIG. 1 is a partial isometric view of a substrate having features formed thereon in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method and apparatus components related to a method and apparatus for providing electrically isolated closely spaced features on a printed circuit board. Accordingly, the apparatus components and methods have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of conventional elements arranged in a non-conventional way, as described herein. The embodiments may be used in various circuits, such as but not limited to, a radio receiver, a radio transmitter, signal drivers, clock circuits, power source circuits, and user input devices. Accordingly, methods and means for achieving these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such embodiments with minimal experimentation.

A method of forming controlled stress fractures in metal produces electrically isolated closely spaced circuit sub-entities for use on a printed wiring board is described herein. A polymeric substrate has a layer of metal adhered to the surface, and the metal layer is formed into entities. Each entity has a fracture initiating feature formed into it, which serves to initiate and/or direct a stress crack that is induced in the metal. The entities are fractured in a controlled manner by subjecting the substrate and the entities to mechanical stress by a rapid thermal excursion, creating a stress fracture in the entity extending from the fracture initiating feature. The stress fracture divides each entity into two or more sub-entities that are electrically isolated from each other by the stress fracture. The resulting structure can be used to form circuitry requiring very fine spaces between conductors on, for instance, high density printed circuit boards. In one embodiment, a transistor structure is formed. The rapid thermal stress may be induced by means of a high intensity arc lamp such as found in xenon strobe lighting.

Figure 5:
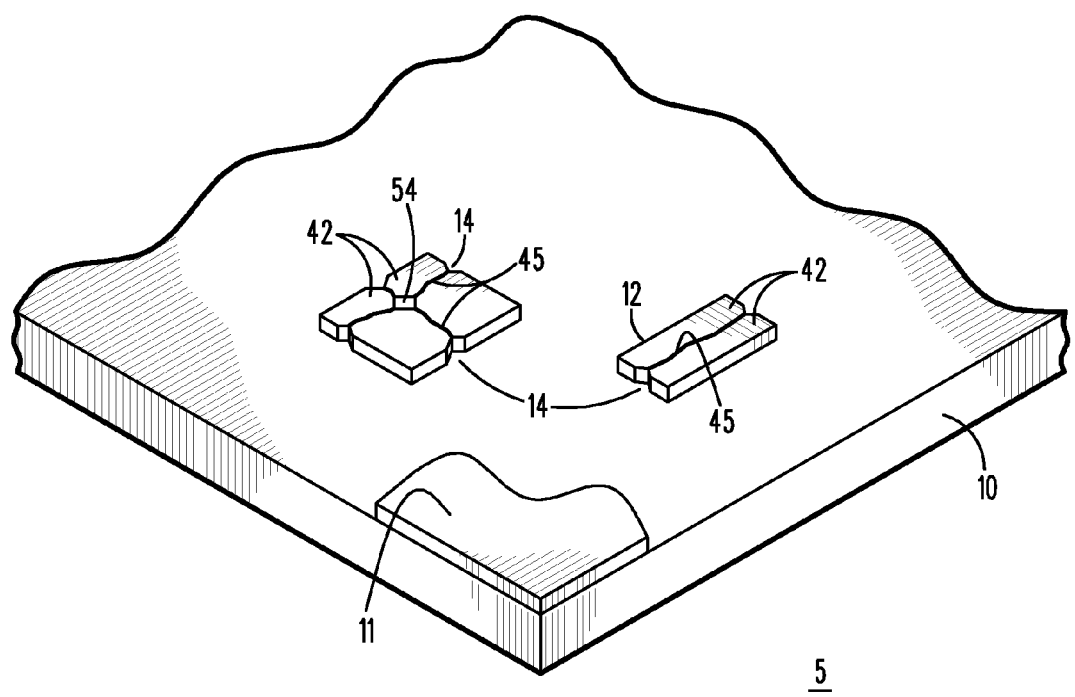
FIG. 5 is a partial isometric view of FIG. 4 in accordance with some embodiments of the invention.

Referring now to FIG. 1, an electrically insulating material serves as a substrate 10 to form printed circuitry thereon. The substrate 10 is typically a polymer or blend of polymers such as polyesters, polyimides, polyamides, polyamide-imides, polyetherimides, polyacrylates, polyethylene terephthalate, polyethylene, polypropylene, polyvinylidene chloride, and polysiloxanes, polycarbonates, polyolefins, polymethyl methacrylate, fabrics, or paper. The polymers may also contain various amounts of conventional fillers as is known in the art for enhanced physical and/or electrical performance, such as glass fibers, carbon fibers, carbon nanotubes, polyimide fibers, etc. Situated on and firmly adhered to a major surface of the substrate 10 is a layer of metal 11, typically copper, but other metals such as aluminum, chromium, gold, iron, nickel, palladium, platinum, silver, titanium, tin, tungsten, zinc, and alloys thereof may also be judiciously employed. The metal layer 11 consists of one or more entities 12 that are typically lines or runners for carrying electrical signals, or they are pads or terminations for attachment of surface mounted components. Certain entities 12 contain one or more fracture initiating features 14, 54 on a perimeter portion of the entity and/or in the interior portion of the entity. Although depicted in the drawing figures as a portion of a triangle, the feature 14 can encompass a number of shapes, but generally a shape having a sharp point or portion is preferable. Since the coefficient of thermal expansion (CTE) of the substrate 10 is much greater than the CTE of the metal entity 12, an increase in the temperature of the substrate and entity will mechanically stress the metal entity. Increasing the temperature will generally develop tension in the metal layer and low compression in the underlying substrate since the substrate is usually much thicker than the metal layer. Tensile stress in conjunction with the fracture initiating features will initiate and propagate a stress crack in the metal entity when the induced mechanical stress reaches a certain level. The amount of stress required to initiate a fracture will vary with each metal and metal/polymer combination. The fracture initiating feature 14 is essentially a "defect" that is intentionally formed in the entity, and serves as a stress concentration point in each entity to relieve the stress by initiating a fracture. Referring now to FIG. 5, the stress fractures 45 extend away from the fracture initiating features, 14 into an interior portion of the affected entities, so as to form two or more sub-entities 42 from the entity. Each sub-entity 42 is now electrically isolated from an adjacent sub-entity by the stress fracture. Thus, a printed circuit board 5 now contains a number of sub-entities that are closely spaced, but electrically isolated from each other.

Figure 2:
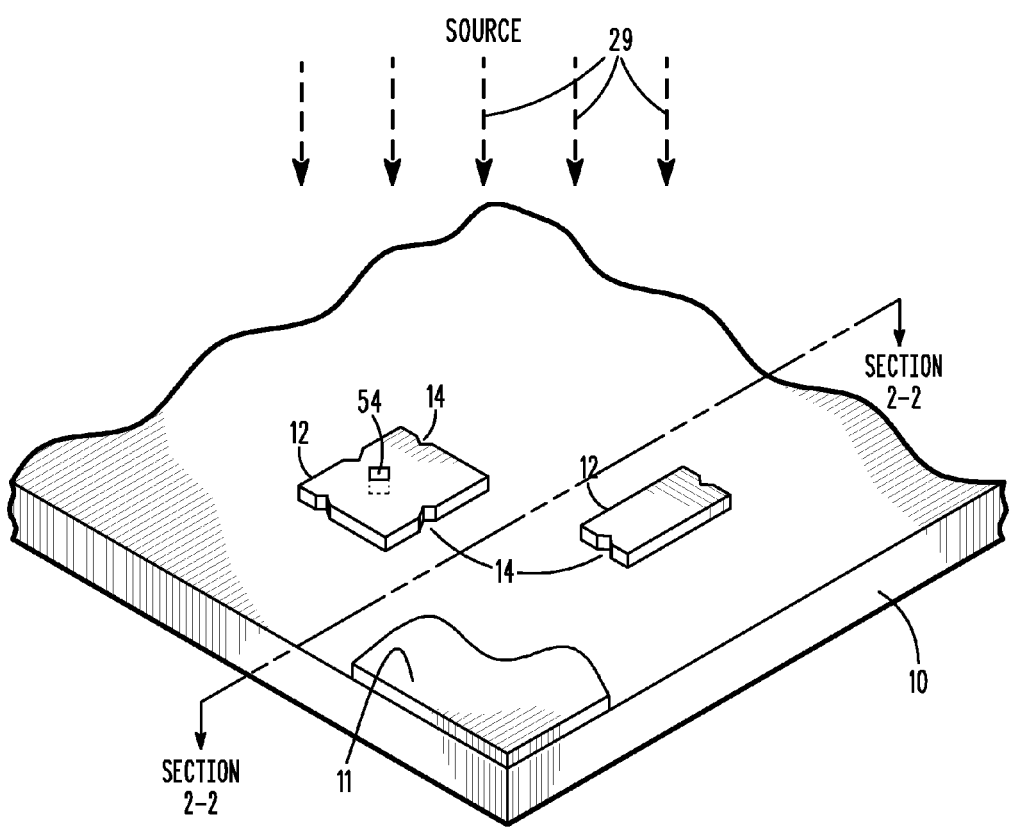
FIG. 2 is a partial isometric view of the substrate of FIG. 1 being exposed to a flash of light in accordance with some embodiments of the invention.
Figure 3:
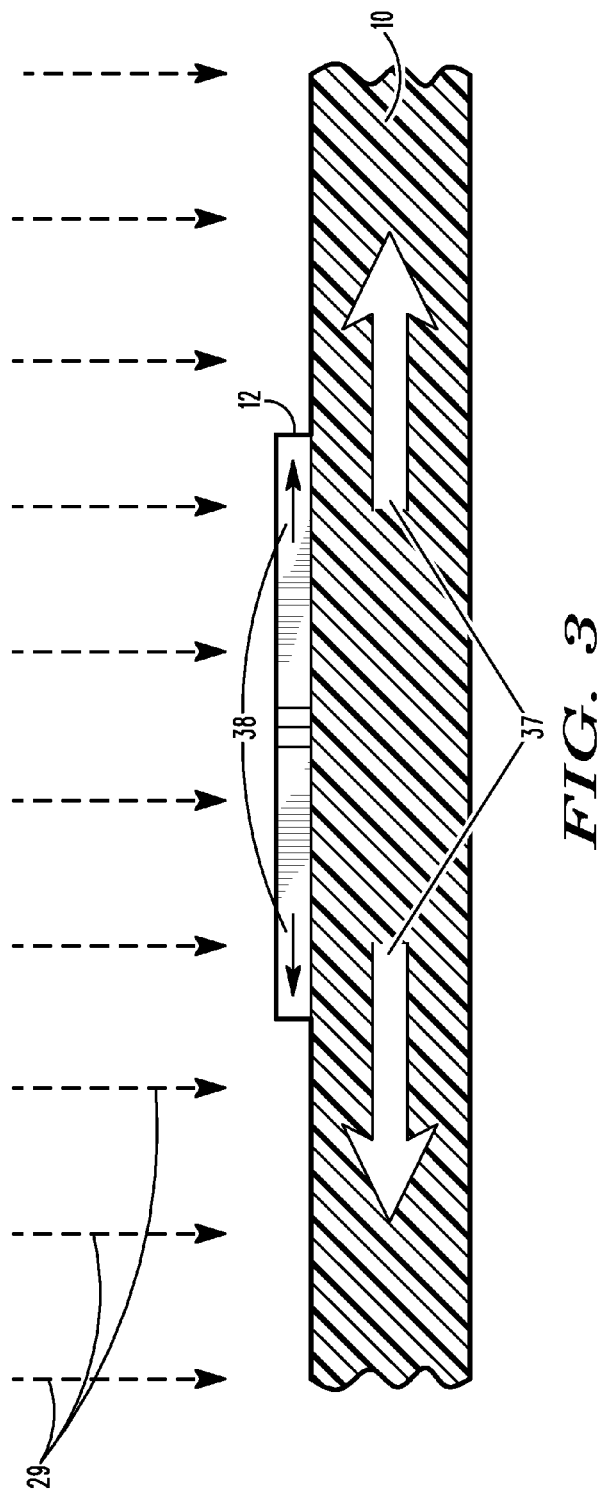
FIG. 3 is a partial cross sectional view of FIG. 2 through section 2-2 in accordance with some embodiments of the invention.
Figure 4:
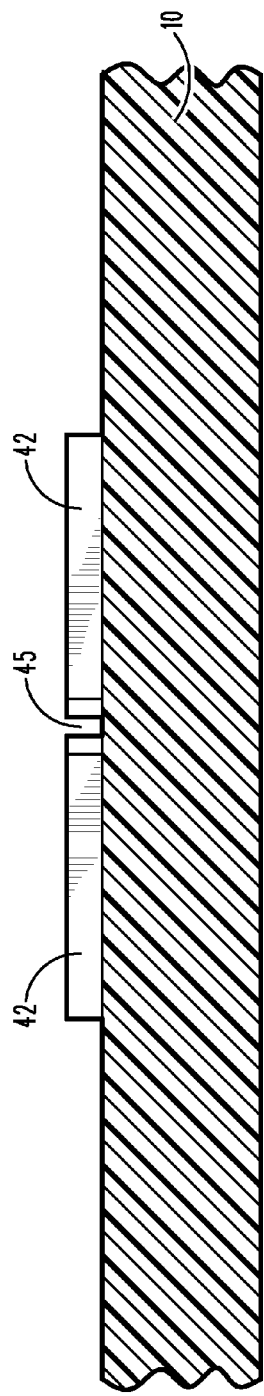
FIG. 4 is a partial cross sectional view of FIG. 3 after exposure to light in accordance with some embodiments of the invention.

Having now briefly described the apparatus of our invention, we shall now describe one or more methods of forming the apparatus, by referring back to FIG. 1. Situated on and firmly adhered to a major surface of the substrate 10 is a layer of metal or conductive ink 11, such as copper, aluminum, chromium, gold, iron, nickel, palladium, platinum, silver, titanium, tin, tungsten, zinc, or other conductive matrices containing these metals of alloys thereof. The metal layer 11 consists of one or more entities 12 that are typically lines or runners for carrying electrical signals, or they are pads or terminations for attachment of surface mounted components. They can be fashioned in conventional way by additive or subtractive plating methods, or they can be printed using high speed graphic arts methods such as gravure, offset, or other contact and non-contact printing techniques. Fracture initiating features 14 are formed on a perimeter portion of one or more of the entities and/or in the interior portion of the entity during the patterning process. Although depicted in the drawing figures as a portion of a triangle, the feature 14 can encompass a number of shapes, but generally a shape having a sharp point or portion is preferable. Since the coefficient of thermal expansion (CTE) of the substrate 10 is much greater than the CTE of the metal entity, when the assembly is subjected to a sufficiently large and rapid thermal stress, the rapid increase in temperature will mechanically stress the metal entity (tensile stress), and a controlled fracture will form in this entity, propagating away from the fracture initiating feature 14 toward an interior portion of the entity. One method of inducing rapid thermal stress is depicted in FIG. 2, where a high intensity source of electromagnetic radiation 29 is impinged upon the substrate 10 and entities 12. One example of a suitable source 29 is a photonic curing system sold by NovaCentrix Company that uses a strobed xenon arc lamp (140-500 nanometers wavelength) which is driven by a 3000 Watt high voltage power supply. A trigger circuit adjusts the strobe energy output between about 10 and about 1000 Joules, the pulse duration ranges from 20 to 500 micro-seconds, and the strobe rate can be adjusted from a single pulse-to-pulse rate of up to 2 kilohertz. Referring now to FIG. 3, a cross sectional view through section 2-2 of FIG. 2, the heat energy from source 29 that impinges upon the assembly causes the metal entity 12 to expand laterally as shown by arrows 38, and causes the substrate 10 to also expand laterally, but at a much larger rate as shown by the large arrows 37. This mismatch in expansion creates a large amount of mechanical stress (tensile stress) in the metal entity, and causes it to fracture. The amount of stress required to initiate fracture will vary with each metal and metal/polymer combination. Since the fracture-initiating feature 14 is essentially a "defect" that is intentionally formed in the entity, it serves to concentrate the stress at that point. When the assembly returns to ambient temperature it can be seen in FIG. 4 that the stress fracture 45 has now caused the entity 12 to be separated into two sub-entities 42 that are electrically isolated by the narrow channel formed by the fracture 45. Referring now to FIG. 5 it can be seen that the stress fractures originate from the apex of the fracture initiating feature 14 and extend into the interior of the entity 12. If one were to locate a fracture initiating feature 54 in the interior portion of the entity instead of around the perimeter, then one could induce a number of fractures, each extending radially from the apexes of fracture initiating feature 54.

In another embodiment of our invention, prior to subjecting the entities to rapid thermal stress, the polymeric substrate is mechanically bent in a convex shape directed away from the major surface, such that an apex of the bend is preferably disposed directly below the fracture initiating feature. This type of bend will develop close to unidirectional tensile stresses on the surface of the metal, which in turn creates a preferential direction for stress crack propagation parallel to the bend axis. A fracture guiding feature 15 can also be formed on or in a major surface of the entity, rather than on the vertical wall of an exterior portion. The feature does not extend completely through the metal, and can be formed by scratching or milling the metal surface.

Having described the apparatus and method of our invention, we now present one example of constructive reduction to practice. A very thin layer of aluminum was deposited on a polyethylene terephthalate substrate by sputtering. The aluminum layer was then patterned into a series of entities that contained fracture initiating features. The patterned assembly was subsequently subjected to a single 300 micro-second pulse from the NovaCentrix xenon strobe light at 1800 volts. After returning to ambient temperature, inspection revealed that a 3 micron channel was formed in the aluminum layer.

Figure 6:
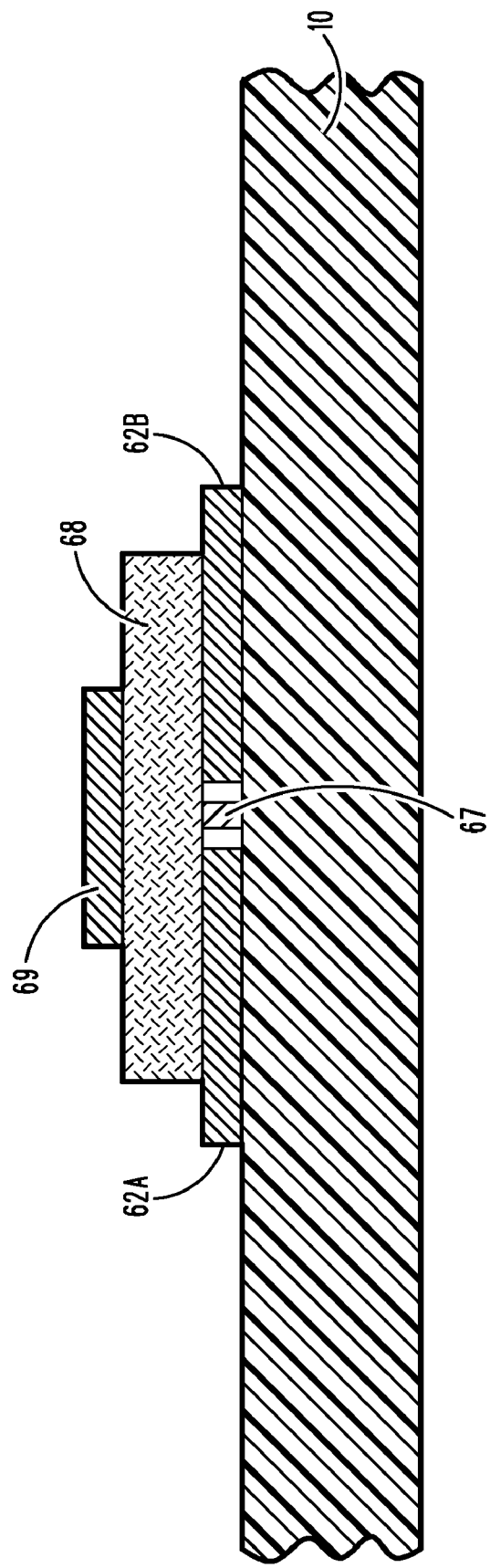
FIG. 6 is a partial cross sectional view of one embodiment of a transistor in accordance with the invention.

In yet another embodiment of our invention, the fractured entities are used as elements in a transistor structure. Referring now to FIG. 6, closely spaced entities 62A and 62B are formed using the methods described above. A semiconductor element 67 is deposited in the gap formed by the stress fracture between adjacent entities 62A, 62B, and a dielectric material 68 is deposited over the semiconductor element. A gate electrode 69 is then formed on the dielectric material 68, to create a transistor, where entities 62A, 62B form the source and drain electrodes. An alternate embodiment of the transistor finds a bottom gate structure wherein a portion of the metal layer acts as a gate electrode, a dielectric material is disposed over the gate electrode, source and drain electrodes are disposed over the dielectric material, and a semiconductor element is disposed on the dielectric between the source and drain electrodes or over the source and drain electrodes.

In summary, a method is disclosed to generate micron sized channels between circuit electrodes by inducing crack propagation via a thermal, chemical or mechanical process or combination there of. We have demonstrated the formation of micron sized channels using, but not limited to, photonic cure technology, and the ability to control the crack propagation for simple pattern generation. Thus, a printed circuit board can now contain a number of sub-entities that are closely spaced, but electrically isolated from each other, using patterning or deposition techniques that are low to medium resolution. In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. Electrically isolated, closely spaced circuit sub-entities for use on a printed wiring board, comprising:
   a polymeric substrate selected from the group consisting of polyesters, polyimides, polyamides, polyamide-imides, polyetherimides, polyacrylates, polyethylene, polypropylene, epoxies, polyvinylidene chloride, polysiloxanes, polycarbonates, fabrics, and paper, having a layer of metal adhered to a major surface thereof;
   the layer of metal patterned into at least one entity;
   the entity having one or more fracture initiating features formed therein;
   one or more stress fractures in the entity, the stress fractures extending away from the fracture initiating features into an interior portion of the entity, so as to form two or more sub-entities from the entity, each sub-entity electrically isolated from an adjacent sub-entity by means of the stress fracture; and
   a fracture guiding feature formed in a major surface of the entity, for guiding the stress fracture in a predetermined direction.

2. Electrically isolated, closely spaced circuit sub-entities for use on a printed wiring board, comprising:
   a polymeric substrate selected from the group consisting of polyesters, polyimides, polyamides, polyamide-imides, polyetherimides, polyacrylates, polyethylene, polypropylene, epoxies, polyvinylidene chloride, polysiloxanes, polycarbonates, fabrics, and paper, having a layer of metal adhered to a major surface thereof;
   the layer of metal patterned into at least one entity;
   the entity having one or more fracture initiating features formed therein; and
   one or more stress fractures in the entity, the stress fractures extending away from the fracture initiating features into an interior portion of the entity, so as to form two or more sub-entities from the entity, each sub-entity electrically isolated from an adjacent sub-entity by means of the stress fracture, wherein the layer of metal comprises one or more metals selected from the group consisting of aluminum, chromium, copper, gold, iron, nickel, palladium, platinum, silver, titanium, tin, tungsten, zinc, and alloys thereof.

3. Electrically isolated, closely spaced circuit sub-entities for use on a printed wiring board, comprising:
   a polymeric substrate selected from the group consisting of polyesters, polyimides, polyamides, polyamide-imides, polyetherimides, polyacrylates, polyethylene, polypropylene, epoxies, polyvinylidene chloride, polysiloxanes, polycarbonates, fabrics, and paper, having a layer of metal adhered to a major surface thereof;
   the layer of metal patterned into at least one entity;
   the entity having one or more fracture initiating features formed therein;
   one or more stress fractures in the entity, the stress fractures extending away from the fracture initiating features into an interior portion of the entity, so as to form two or more sub-entities from the entity, each sub-entity electrically isolated from an adjacent sub-entity by means of the stress fracture, wherein two sub-entities that are adjacent to each other comprise a source electrode and a drain electrode, and further comprising a semiconductor element disposed in the stress fracture; and
   a dielectric disposed over the semiconductor element, and a gate electrode disposed on the dielectric.

4. Electrically isolated, closely spaced circuit sub-entities for use on a printed wiring board, comprising:
   a polymeric substrate selected from the group consisting of polyesters, polyimides, polyamides, polyamide-imides, polyetherimides, polyacrylates, polyethylene, polypropylene, epoxies, polyvinylidene chloride, polysiloxanes, polycarbonates, fabrics, and paper, having a layer of metal adhered to a major surface thereof;
   the layer of metal patterned into at least one entity;
   the entity having one or more fracture initiating features formed therein; and
   one or more stress fractures in the entity, the stress fractures extending away from the fracture initiating features into an interior portion of the entity, so as to form two or more sub-entities from the entity, each sub-entity electrically isolated from an adjacent sub-entity by means of the stress fracture, wherein a sub-entity comprises a gate electrode, and further comprising a dielectric disposed over the gate electrode, a semiconductor element disposed on the dielectric and source and drain electrodes disposed on the semiconductor element.

5. Electrically isolated, closely spaced circuit sub-entities for use on a printed wiring board, comprising:
   a polymeric substrate selected from the group consisting of polyesters, polyimides, polyamides, polyamide-imides, polyetherimides, polyacrylates, polyethylene, polypropylene, epoxies, polyvinylidene chloride, polysiloxanes, polycarbonates, fabrics, and paper, having a layer of metal adhered to a major surface thereof;
   the layer of metal patterned into at least one entity;
   the entity having one or more fracture initiating features formed therein;
   one or more stress fractures in the entity, the stress fractures extending away from the fracture initiating features into an interior portion of the entity, so as to form two or more sub-entities from the entity, each sub-entity electrically isolated from an adjacent sub-entity by means of the stress fracture; and
   a dielectric layer situated on the at least one entity, and a second layer of metal situated on the dielectric layer, the second layer of metal patterned into at least one entity having one or more fracture initiating features formed therein and one or more stress fractures extending away from the fracture initiating features into an interior portion of the entity, so as to form two or more sub-entities from the entity.

6. Electrically isolated, closely spaced circuit sub-entities for use on a printed wiring board, comprising:
   a polymeric substrate selected from the group consisting of polyesters, polyimides, polyamides, polyamide-imides, polyetherimides, polyacrylates, polyethylene, polypropylene, epoxies, polyvinylidene chloride, polysiloxanes, polycarbonates, fabrics, and paper, having a layer of metal adhered to a major surface thereof;
   the layer of metal patterned into at least one entity;
   the entity having one or more fracture initiating features formed therein; and
   one or more stress fractures in the entity, the stress fractures extending away from the fracture initiating features into an interior portion of the entity, so as to form two or more sub-entities from the entity, each sub-entity electrically isolated from an adjacent sub-entity by means of the stress fracture, wherein the fracture initiating feature is on a perimeter portion of the entity.

7. Electrically isolated, closely spaced circuit sub-entities for use on a printed wiring board, comprising:
   a polymeric substrate selected from the group consisting of polyesters, polyimides, polyamides, polyamide-imides, polyetherimides, polyacrylates, polyethylene, polypropylene, epoxies, polyvinylidene chloride, polysiloxanes, polycarbonates, fabrics, and paper, having a layer of metal adhered to a major surface thereof;
   the layer of metal patterned into at least one entity;
   the entity having one or more fracture initiating features formed therein; and
   one or more stress fractures in the entity, the stress fractures extending away from the fracture initiating features into an interior portion of the entity, so as to form two or more sub-entities from the entity, each sub-entity electrically isolated from an adjacent sub-entity by means of the stress fracture, wherein the fracture initiating feature is on an interior portion of the entity.

8. A controlled method of forming closely spaced electrically isolated circuit sub-entities, comprising:
   providing a polymeric substrate having a metal layer adhered to a major surface, the metal layer formed into one or more entities, each entity having a fracture initiating feature formed therein;
   subjecting the entities to rapid thermal stress in a manner sufficient to cause a controlled stress fracture to form in the entity, propagating from the fracture initiating feature toward an interior portion of the entity; and
   wherein the stress fracture divides each entity into two or more sub-entities, electrically isolated from each other by means of the stress fracture.

9. A controlled method of forming closely spaced electrically isolated circuit sub-entities, comprising:
   providing a polymeric substrate having a metal layer adhered to a major surface, the metal layer formed into one or more entities, each entity having a fracture initiating feature formed therein;
   subjecting the entities to rapid thermal stress in a manner sufficient to cause a controlled stress fracture to form in the entity, propagating from the fracture initiating feature toward an interior portion of the entity, wherein subjecting the entities to rapid thermal stress causes a differential linear expansion between the entity and the polymeric substrate; and
   wherein the stress fracture divides each entity into two or more sub-entities, electrically isolated from each other by means of the stress fracture.

10. A controlled method of forming closely spaced electrically isolated circuit sub-entities, comprising:
    providing a polymeric substrate having a metal layer adhered to a major surface, the metal layer formed into one or more entities, each entity having a fracture initiating feature formed therein;
    subjecting the entities to rapid thermal stress in a manner sufficient to cause a controlled stress fracture to form in the entity, propagating from the fracture initiating feature toward an interior portion of the entity; and
    wherein the stress fracture divides each entity into two or more sub-entities, electrically isolated from each other by means of the stress fracture;
    wherein subjecting the entities to rapid thermal stress comprises exposure to electromagnetic radiation; and
    wherein exposure to electromagnetic radiation comprises exposure to light from a xenon light source.

11. A controlled method of forming closely spaced electrically isolated circuit sub-entities, comprising:
    providing a polymeric substrate having a metal layer adhered to a major surface, the metal layer formed into one or more entities, each entity having a fracture initiating feature formed therein;
    subjecting the entities to rapid thermal stress in a manner sufficient to cause a controlled stress fracture to form in the entity, propagating from the fracture initiating feature toward an interior portion of the entity; and
    wherein the stress fracture divides each entity into two or more sub-entities, electrically isolated from each other by means of the stress fracture; and
    further comprising providing a semiconductor element in a stress fracture between two adjacent sub-entities, a dielectric disposed over the semiconductor element, and a gate electrode disposed on the dielectric.

12. A controlled method of forming closely spaced electrically isolated circuit sub-entities, comprising:
    providing a polymeric substrate having a metal layer adhered to a major surface, the metal layer formed into one or more entities, each entity having a fracture initiating feature formed therein;

bending the polymeric substrate in a convex shape away from the major surface, an apex of the bend disposed directly below the fracture initiating feature;

subjecting the entities to rapid thermal stress in a manner sufficient to cause a controlled stress fracture to form in the entity, propagating from the fracture initiating feature toward an interior portion of the entity; and wherein the stress fracture divides each entity into two or more sub-entities, electrically isolated from each other by means of the stress fracture.

13. A controlled method of forming closely spaced electrically isolated circuit sub-entities, comprising:

providing a polymeric substrate having a metal layer adhered to a major surface, the metal layer formed into one or more entities, each entity having a fracture initiating feature formed therein;

fracturing each entity in a controlled manner by subjecting the substrate and the entities to a rapid thermal excursion sufficient to create a stress fracture in the entity initiating from the fracture initiating feature; and wherein the stress fracture divides each entity into two or more sub-entities, electrically isolated from each other by means of the stress fracture.

14. A controlled method of forming closely spaced electrically isolated circuit sub-entities, comprising:

providing a polymeric substrate having a metal layer adhered to a major surface, the metal layer formed into one or more entities, each entity having a fracture initiating feature formed therein;

fracturing each entity in a controlled manner by subjecting the substrate and the entities to a rapid thermal excursion sufficient to create a stress fracture in the entity initiating from the fracture initiating feature, wherein subjecting the substrate and the entities to rapid thermal excursion causes a differential linear expansion between the entity and the polymeric substrate; and wherein the stress fracture divides each entity into two or more sub-entities, electrically isolated from each other by means of the stress fracture.

15. A controlled method of forming closely spaced electrically isolated circuit sub-entities, comprising:

providing a polymeric substrate having a metal layer adhered to a major surface, the metal layer formed into one or more entities, each entity having a fracture initiating feature formed therein;

fracturing each entity in a controlled manner by subjecting the substrate and the entities to a rapid thermal excursion sufficient to create a stress fracture in the entity initiating from the fracture initiating feature, wherein subjecting the entities to rapid thermal excursion comprises exposure to electromagnetic radiation, wherein exposure to electromagnetic radiation comprises exposure to light from a xenon light source; and wherein the stress fracture divides each entity into two or more sub-entities, electrically isolated from each other by means of the stress fracture.

16. A controlled method of forming closely spaced electrically isolated circuit sub-entities, comprising:

providing a polymeric substrate having a metal layer adhered to a major surface, the metal layer formed into one or more entities, each entity having a fracture initiating feature formed therein;

fracturing each entity in a controlled manner by subjecting the substrate and the entities to a rapid thermal excursion sufficient to create a stress fracture in the entity initiating from the fracture initiating feature;

wherein the stress fracture divides each entity into two or more sub-entities, electrically isolated from each other by means of the stress fracture and providing a semiconductor element in a stress fracture between two adjacent sub-entities, a dielectric disposed over the semiconductor element, and a gate electrode disposed on the dielectric.

17. A controlled method of forming closely spaced electrically isolated circuit sub-entities, comprising:

providing a polymeric substrate having a metal layer adhered to a major surface, the metal layer formed into one or more entities, each entity having a fracture initiating feature formed therein;

bending the polymeric substrate in a convex shape away from the major surface, an apex of the bend disposed directly below the fracture initiating feature;

fracturing each entity in a controlled manner by subjecting the substrate and the entities to a rapid thermal excursion sufficient to create a stress fracture in the entity initiating from the fracture initiating feature; and wherein the stress fracture divides each entity into two or more sub-entities, electrically isolated from each other by means of the stress fracture.

* * * * *